United States Patent
Mabuchi et al.

(10) Patent No.: US 7,518,168 B2
(45) Date of Patent: Apr. 14, 2009

(54) MOS TYPE SOLID-STATE IMAGE PICKUP DEVICE AND DRIVING METHOD COMPRISED OF A PHOTODIODE, A DETECTION PORTION, AND A TRANSFER TRANSISTOR

(75) Inventors: Keiji Mabuchi, Kanagawa (JP); Takahisa Ueno, Kanagawa (JP)

(73) Assignee: Sony Corporation, Tokyo (JP)

( * ) Notice: Subject to any disclaimer, the term of this patent is extended or adjusted under 35 U.S.C. 154(b) by 1 day.

(21) Appl. No.: 11/776,293

(22) Filed: Jul. 11, 2007

(65) Prior Publication Data
US 2007/0278533 A1    Dec. 6, 2007

Related U.S. Application Data

(63) Continuation of application No. 10/046,402, filed on Jan. 14, 2002, now Pat. No. 7,259,790.

(30) Foreign Application Priority Data
Jan. 15, 2001   (JP)   .................. P2001-006657

(51) Int. Cl.
    *H01L 27/148*   (2006.01)
(52) U.S. Cl. .................. 257/230; 257/223; 257/233; 257/292; 257/E27.132; 257/E27.162
(58) Field of Classification Search .................. 257/223, 257/230, 292, 229, 433, 435, 98, 215, 233, 257/290, 291, E27.15, E27.132, E27.133, 257/E27.152, E27.162
See application file for complete search history.

(56) References Cited

U.S. PATENT DOCUMENTS

| | | | |
|---|---|---|---|
| 3,896,485 A * | 7/1975 | Early | .................. 257/223 |
| 4,688,098 A | 8/1987 | Kon et al. | |
| 5,008,758 A | 4/1991 | Burke | |
| 5,291,044 A | 3/1994 | Gaboury et al. | |
| 5,619,049 A | 4/1997 | Kim | |
| 5,698,874 A | 12/1997 | Hayashi | |
| 5,804,465 A | 9/1998 | Banghart et al. | |
| 5,900,623 A | 5/1999 | Tsang et al. | |
| 5,942,774 A | 8/1999 | Isogai et al. | |
| 6,002,123 A | 12/1999 | Suzuki | |
| 6,218,692 B1 | 4/2001 | Guidash | |
| 6,727,521 B2 | 4/2004 | Merril | |
| 6,784,935 B1 * | 8/2004 | Uya et al. | .................. 348/311 |

FOREIGN PATENT DOCUMENTS
EP    0854516    7/1998

OTHER PUBLICATIONS
European Search Report corresponding to European Serial No. 02000526.0; Mar. 9, 2006; 3 pages.

* cited by examiner

*Primary Examiner*—Sue A Purvis
*Assistant Examiner*—Fazli Erdem
(74) *Attorney, Agent, or Firm*—Sonnenschein Nath & Rosenthal LLP

(57) ABSTRACT

An MOS type solid-state image pickup device including pixels each of which comprises a photodiode PD, a detection portion N and a transfer transistor $Q_T$ for transferring the charges accumulated in the photodiode PD to the detection portion N, wherein the gate voltage of the transfer transistor $Q_T$ when the charges are accumulated in the photodiode PD is set to a negative.

3 Claims, 11 Drawing Sheets

CROSS-SECTIONAL VIEW OF PHOTODIODE AND
TRANSFER TRANSISTOR OF THIRD EMBODIMENT

X : DEFECTS OF INTERFACE

DIAGRAM OF CONSTRUCTION OF EMBODIMENT

EXAMPLE OF BUFFER CIRCUIT (31)

CROSS-SECTIONAL VIEW OF PHOTODIODE AND
TRANSFER TRANSISTOR OF FIRST EMBODIMENT

X : DEFECTS OF INTERFACE

CROSS-SECTIONAL VIEW OF PHOTODIODE AND
TRANSFER TRANSISTOR OF SECOND EMBODIMENT

CROSS-SECTIONAL VIEW OF PHOTODIODE AND TRANSFER TRANSISTOR OF THIRD EMBODIMENT

X : DEFECTS OF INTERFACE

DIAGRAM OF DEVICE OF DARK CURRENT

CROSS-SECTIONAL VIEW OF PRIOR ART

MOS TYPE SOLID-STATE IMAGE PICKUP DEVICE AND DRIVING METHOD COMPRISED OF A PHOTODIODE, A DETECTION PORTION, AND A TRANSFER TRANSISTOR

CROSS REFERENCE TO RELATED APPLICATIONS

The present application is a continuation of U.S. patent application Ser. No. 10/046,402, filed Jan. 14, 2002, incorporated herein by reference to the extent permitted by law. This application claims priority to Japanese Patent Application No. 2001-006657 filed Jan. 15, 2001, both of which are incorporated herein by reference to the extent permitted by law.

BACKGROUND OF THE INVENTION

1. Field of the Invention

The present invention relates to a solid-state image pickup device, and particularly to an MOS type solid-state image pickup device and a method of driving the MOS type solid-state image pickup device.

2. Description of the Related Art

MOS type solid-state image pickup devices are known as one type of solid-state image pickup devices. Further, as one of the MOS type solid-state image pickup device is known a solid-state image pickup device of transferring signal charges of photodiodes constituting pixels to a detectin portion using transfer transistors and then reading out the signal charges. This type of MOS type solid-state image pickup device has a CMOS logic circuit in the same chip and the pixels are operated with the same single low-voltage power source as the logic circuit unlike the CCD type solid-state image pickup deice. Accordingly, for example when the transfer transistors aren-channel MOS transistors, the gate voltage of the transfer transistor in each pixel has two values of 0V and a power resource voltage Vdd.

Two components, one of which is signal charge corresponding to the amount of incident light and the other of which is a dark current component (dark electrons) flowing in the photodiode of each pixel even when no light is incident, are accumulated in the photodiodes during a charge accumulation period. The dark electrons are not separated from the signal charge in the reading operation, and dispersion of the dark electrons causes noises. Particularly, the dispersion of dark current every pixel causes a fixed pattern noise, and an image is achieved as if it is picked up through frosted glass. Further, the time-dispersion of the dark current causes a random noise. Accordingly, it is an important problem for the MOS type solid-state image pickup device to reduce the dark current at maximum.

An embedded photodiode is known as a conventional technique of reducing the dark current. The most dark current generating source is the interface between Si and $SiO_2$ above the photodiode. If this area is depleted, dark current would flow into the photodiode. Accordingly, the oxide film interface on an n-type semiconductor region constituting the photodiode is neutralized by a p-type region to suppress occurrence of dark current.

FIG. 11 shows a part of a pixel having a conventional embedded photodiode, that is, shows the cross-sectional structure of an embedded photodiode and a transfer transistor.

As shown in FIG. 11 a p-type semiconductor well region 72 is formed on an n-type or p-type semiconductor substrate 71, and a photodiode PD and a transfer transistor $Q_T$ are formed in a pixel area sectioned by an element separating layer ($SiO_2$ layer) 73 formed by selective oxidation (LOCOS) of the p-type semiconductor well region 72, thereby forming a pixel 70, that is, the main part thereof. The photodiode PD is formed as a so-called embedded photodiode by forming an n-type semiconductor region 74 serving as a charge accumulating area in the p-type semiconductor well region 72 and then forming a p-type semiconductor region 75 having the opposite conduction type to the n-type semiconductor region 74 on the upper surface of the n-type semiconductor region 74. The transfer transistor $Q_T$ is constructed by setting the n-type semiconductor region 74 of the photodiode PD as one source/drain region and forming a transfer gate electrode 78 through a gate insulating film (for example, $SiO_2$ film) 77 between the region 74 and the other n-type source/drain region 76 formed in the p-type semiconductor well region 72. The other n-type semiconductor region 76 of the transfer transistor $Q_T$ is constructed as a detection portion.

In this construction, the p-type semiconductor region 75 is formed at the interface between the n-type semiconductor region 74 and the oxide film 79 above the n-type semiconductor region 74 constituting the photodiode PD, so that the depletion of the interface can be prevented and occurrence of dark current from the interface can be suppressed. This photodiode is the embedded photodiode.

The MOS type solid-state image pickup device is required to operate with a low voltage. For example, as compared with the power source voltage of 12V for the CCD type solid-state image pickup device, a low power source voltage of 3V or less is needed to the MOS type solid-state image pickup device. In this case, signals of photodiodes are read out only within such a low voltage range that the signals can be transmitted from the photodiodes, so that it is difficult to keep a sufficient saturation signal amount. Accordingly, the dynamic range is small and the gradation cannot be adjusted.

On the other hand, occurrence of dark current from the oxide film interface of the photodiodes is suppressed by the embedded photodiodes, however, the other residual dark current components produce fixed pattern noises and random noises under low illumination. Therefore, more improvements have been required to be made for MOS type solid state image pickup devices in order to have high S/N and high sensitivity.

Further, in the MOS type solid-state image pickup device, when light having a light amount above saturation level is incident to the photodiodes PD, photoelectrically-converted signal charges, that is, photoelectrons in this case overflow from the photodiodes PD. The photoelectrons thus overflowing are diffused and expanded in the p-type semiconductor well region 72, and invade into the photodiodes PD of the surrounding pixels to cause false signals. This phenomenon is called as "blooming". In order to prevent the blooming, the overflow path of the overflowing photoelectrons (so-called as "overflow path") is placed in advance to prevent diffusion of the photoelectrons into the p-type semiconductor well region 72.

In the prior art, the overflow path is set in the channel portion of the transfer transistor $Q_T$, and the photoelectrons overflowing from the photodiodes PD are made to flow out through the channel portion of the transfer transistor $Q_T$ into the detection portion (n-type source/drain region 76) side. The overflowing photoelectrons are made to flow out to a reset transistor side by the detection portion as not shown.

However, in this construction, as the potential of the channel portion of the transfer transistor $Q_T$ is lowered, that is, when 0V is applied to the transfer gate electrode 78, the potential of the channel portion is equal to about 0.5 to 0.6V, and as the potential of this channel portion is lowered to 0V side, the amount of charges which can be passed through the overflow path is reduced.

In the MOS type solid-state image pickup device, the dynamic range is enlarged by increasing the saturation signal amount. Therefore, it is required that the amplitude of the gate voltage to be applied to the transfer gate is set to a large value, that is, the potential of the channel portion of the transfer transistor during the charge accumulation period is lowered. However, the conventional MOS type solid-state image pickup device has a problem that the enlargement of the dynamic range by increasing the saturation signal amount is incompatible with the ensuring of the performance of the overflow path as described above.

The foregoing description is made on the assumption that electrons are set as signal charges and the n-channel MOS transistor is used as the transfer transistor. However, the same problem also occurs on the assumption that holes are set as signal charges and a p-channel MOS transistor having the opposite conduction type is used as the transfer transistor.

SUMMARY OF THE INVENTION

The present invention has been implemented in view of the foregoing situation, and has an object to provide a solid-state image pickup device that can further reduce dark current, and a method of driving the solid-state image pickup device.

The present invention has another object to provide a solid-state image pickup device that secures a function of overflow path, thereby enabling to more surely suppress blooming, and a method of driving the solid-state image pickup device.

A solid-state image pickup device and a method of driving the solid-state image pickup device according to the present invention include a photodiode, a detection portion and a transfer transistor for transferring charges accumulated in the photodiode to the detection portion, wherein the gate voltage of the transfer transistor when electrons or holes are accumulated as the charges in the photodiode is set to a negative voltage or positive voltage.

In the present invention, charges overflowing from the photodiode are made to flow out through a bulk out of a channel portion of the transfer transistor. An area through which the charges overflow from the photodiode is formed of an area having a lower concentration than the semiconductor well region.

In the present invention, the gate voltage of the transfer transistor when electrons or holes are accumulated as the charges in the photodiode is set to a negative voltage or positive voltage, whereby the channel portion of the transfer transistor is inverted and occurrence of dark current components from the interface between the channel portion and the gate insulating film can be suppressed.

Further, the charges overflowing from the photodiode are made to flow out through the bulk out of the channel portion of the transfer transistor, whereby the area of a so-called overflow path is increased and the function of the overflow path is improved.

DETAILED DESCRIPTION OF THE PREFERRED EMBODIMENTS

There are a variety of views about origins of generating residual dark current components other than the dark current occurring from the interface between the upper surface of a photodiode and an insulating film. For example, a first view is that dark current from the oxide film interface above the photodiode cannot be sufficiently suppressed, a second view is that there are defects at the end portion of LOCOS (selective oxidation) insulating later serving as an element separation layer and they serve as dark-current generating origins, a third view is that minority carriers in a p-type semiconductor well region or p-type semiconductor substrate are diffused, a fourth view that dark current thermally occurs in the depletion layer between the photodiode and the p-type well region, etc.

The inventors of this application have carefully analyzed the residual dark current components and discovered the following points.

Figure 10:
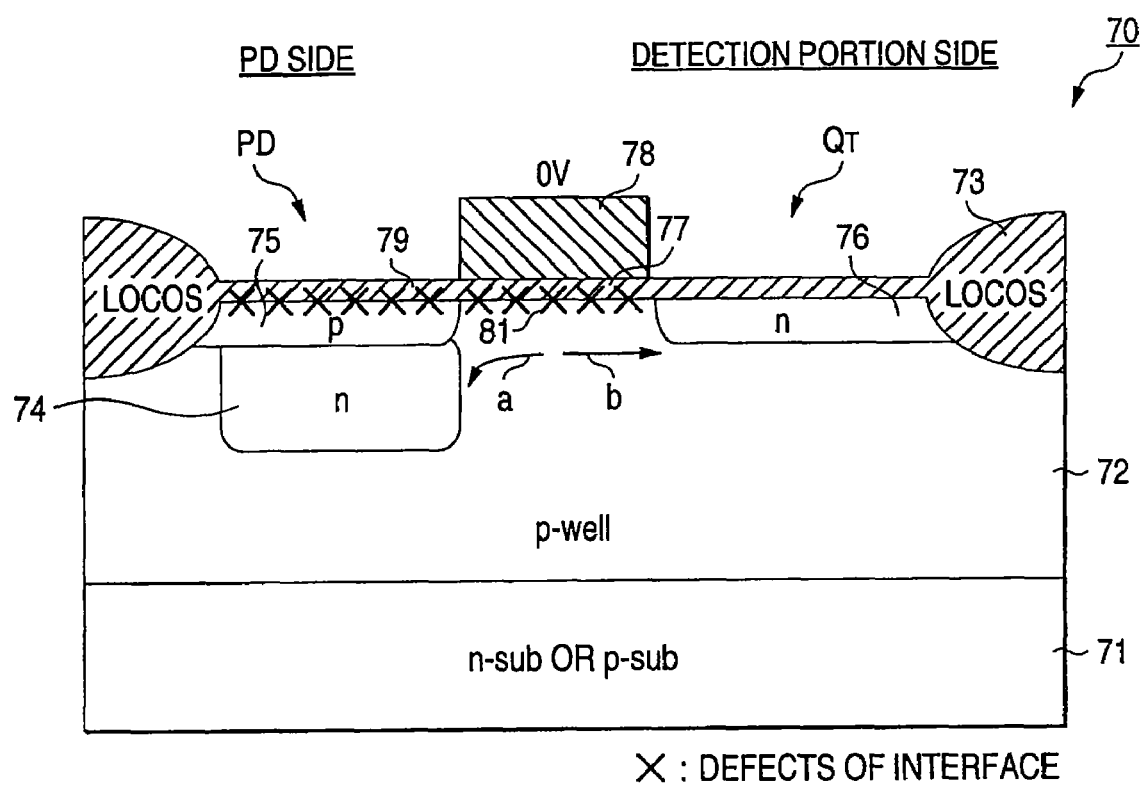
FIG. 10 is a cross-sectional view to describe occurrence of dark current.
Figure 11:
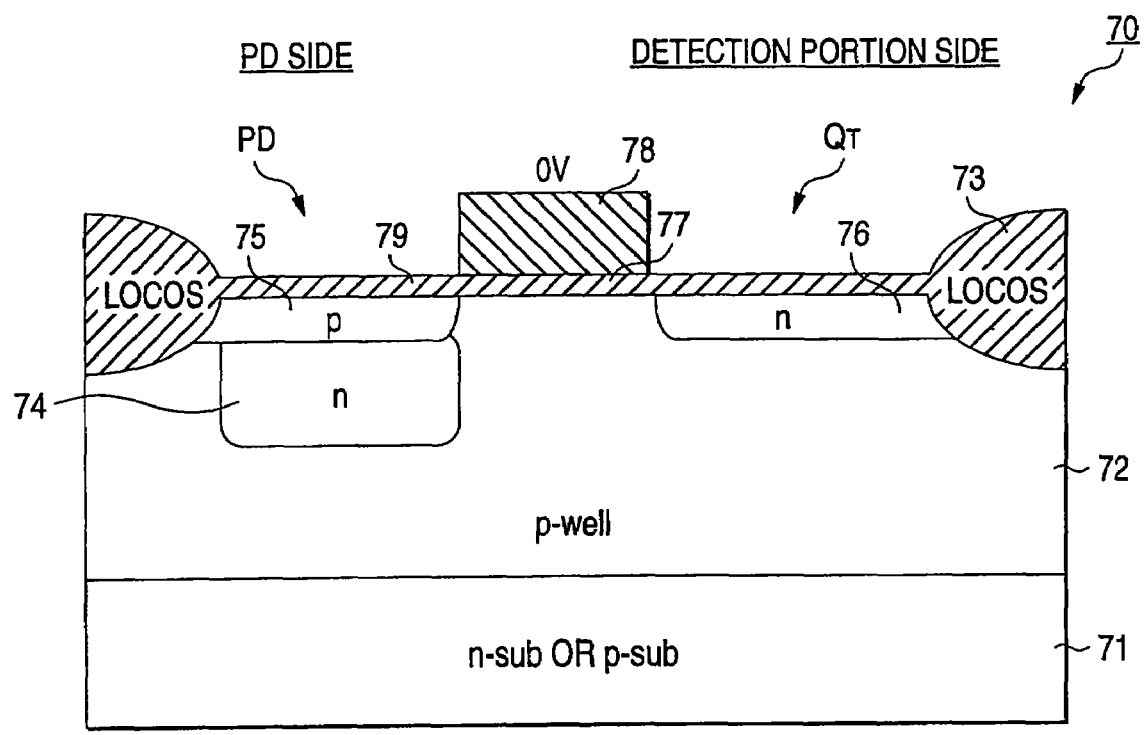
FIG. 11 is a cross-sectional view showing the constituting part of a photodiode and a transfer transistor which constitute a pixel of a conventional MOS type solid-state image pickup device.

(1) Dark current from the interface of the insulating film (for example, gate oxide film) below the transfer gate is dominant for the embedded photodiode. As indicated by arrows a, b of FIG. 10 (the same construction as shown in FIG. 11), the dark current occurring at the insulating film interface below the transfer gate due to defects 81 of the interface divisionally flows into an n-type semiconductor region 74 of a photodiode PD and an n-type source/drain region 76 serving as a detection portion.

(2) In the interface of the insulating film below the transfer gate, the effect of reducing the dark current is small even when a p-type layer is formed to have such a small thickness that the signal charges of the photodiode can be transmitted with a low voltage of 3.3V or less.

(3) Almost of the residual dark current components can be reduced by setting the transfer gate to a negative voltage during an accumulation period to thereby form a channel of holes at the oxide film interface below the transfer gate, whereby S/N is dramatically enhanced and the image quality is rapidly improved.

By selecting the construction of (3), the saturation charge amount of the photodiode is increased, so that the dynamic range can be enlarged and the gradation of images can be enhanced. This is because if the low level of the gate voltage to be applied to the transfer gate is set to a negative potential while the high level is not varied, it increases the amplitude of the transfer gate by the corresponding amount. The effect of increasing the saturation charge amount is achieved by setting the transfer gate to the negative potential, and the negative potential is not needed to be set to such a level as to generate a channel of holes.

Further, it is preferable that an overflow path for discharge charges overflowing from the photodiode is formed in a bulk out of the channel portion of the transfer transistor. That is, in a surrounding area of the photodiode which is located in a predetermined direction from the photodiode, no semiconductor well region is formed, and an n-type semiconductor region or p-type semiconductor region having an impurity concentration lower than that of the p-type semiconductor well region is formed in place of the p-type semiconductor well region. This $n^-$ or $p^-$ type semiconductor region having the low impurity concentration functions as an overflow path to discharge charges overflowing to the substrate side, the detection portion side or both the sides.

With this construction, the overflow path can be set, not in a narrow channel portion, but in a bulk portion having a large cross-sectional area. Since the overflow path can be set to be broad, the blooming preventing capability is enhanced, so that the potential of the overflow path can be set to a low value, the saturation signal amount of the photodiode can be increased and the dynamic range can be enlarged. Particularly when the negative potential is applied to the transfer gate, in the conventional MOS type solid-state image pickup device, the function of the overflow path of the channel portion is greatly lowered. Therefore, the structure of the present invention is effective.

Next, preferred embodiments according to the present invention will be described in detail with reference to the accompanying drawings.

Figure 1:
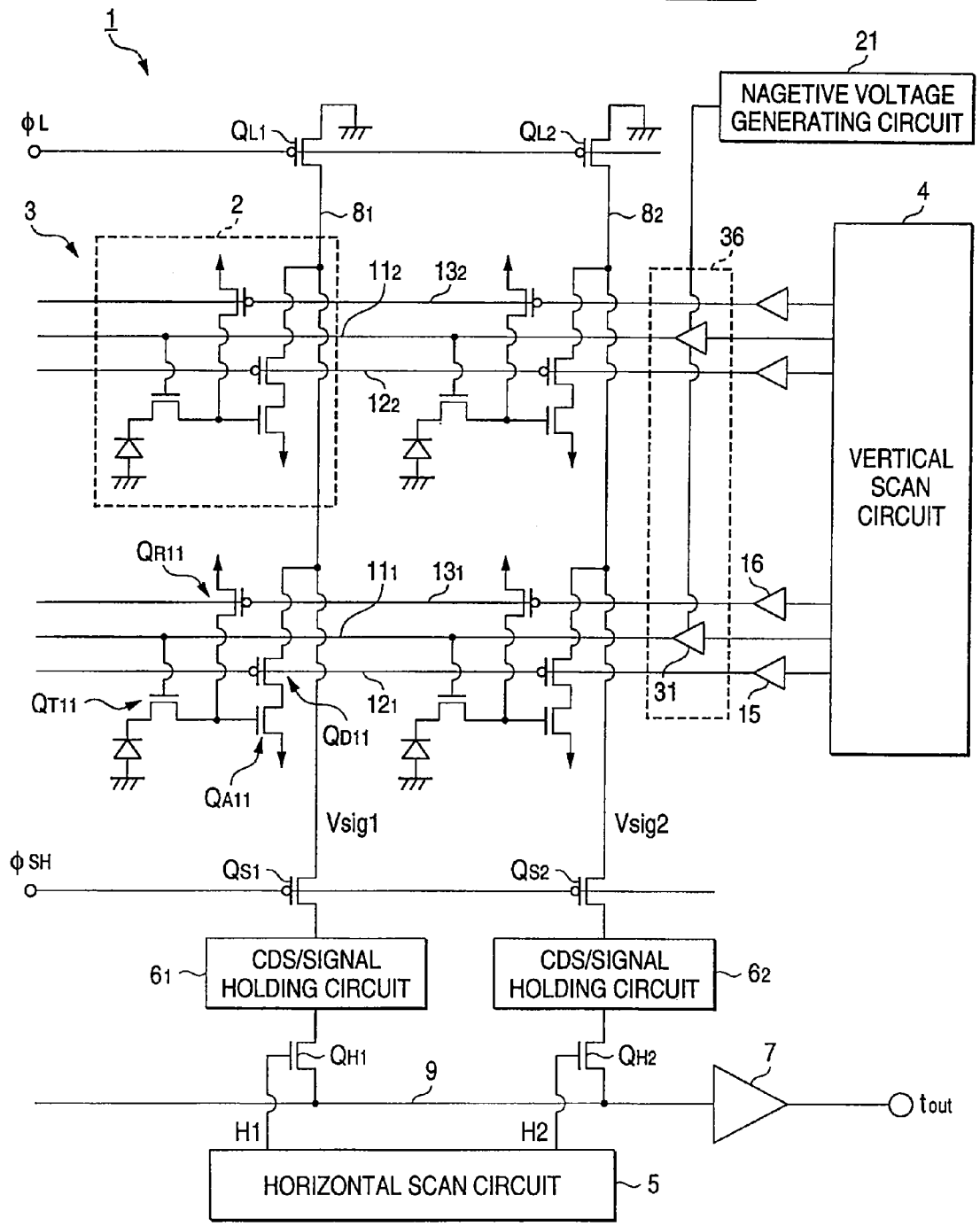
FIG. 1 is a diagram showing an embodiment according to a solid-state image pickup device of the present invention.

FIG. 1 is a diagram showing an embodiment of a solid-state image pickup device, that is, MOS type solid-state image pickup device according to the present invention.

The MOS solid-state image pickup device 1 according to this embodiment comprises a sensor portion 3 having plural pixels 2 ($2_{11}$, $2_{12}$, $2_{21}$, $2_{22}$) arranged in a matrix form, a vertical scan circuit 4 and a horizontal scan circuit 5 for driving the sensor portion 3, a CDS (correlated double sampling)/signal holding circuit 6 ($6_1$, $6_2$, . . . ) for receiving the signals of pixels 2 of first line from the sensor portion 3, and an output amplifier 7.

In this embodiment, the pixels 2 are illustrated as 2 pixels×2 pixels for convenience's sake, however, a large number of pixels are actually arranged.

Each pixel 2 comprises a photodiode PD ($PD_{11}$, $PD_{12}$, $PD_{21}$, $PD_{22}$) for performing photoelectric conversion, a transfer transistor (MOS transistor) $Q_T$ ($Q_{T11}$, $Q_{T12}$, $Q_{T21}$, $Q_{T22}$) for transferring the signal charges of the photodiode PD to a detection portion N ($N_{11}$, $N_{12}$, $N_{21}$, $N_{22}$), an amplifying transistor (MOS transistor) $Q_A$ ($Q_{A11}$, $Q_{A12}$, $Q_{A21}$, $Q_{A22}$) for outputting the potential of the detection portion N to a vertical signal line 8, an address transistor (MOS transistor) $Q_D$ ($Q_{D11}$, $Q_{D12}$, $Q_{D21}$, $Q_{D22}$) for selecting a line of the pixels 2, and a reset transistor (MOS transistor) $Q_R$ ($Q_{R11}$, $Q_{R12}$, $Q_{R21}$, $Q_{R22}$) for resetting the potential of the detection portion N.

The cathode of the photodiode PD is connected to one main electrode of the transfer transistor $Q_T$, and the anode thereof is connected to the ground. The other main electrode of the transfer electrode $Q_T$ is connected to the gate electrode of the amplifying transistor $Q_A$ and also connected to one main electrode of the reset transistor $Q_R$. The gate electrode of the transfer transistor $Q_T$ is connected from the vertical scan circuit 4 to a vertical read-out line 11.

One main electrode of the amplifying transistor $Q_A$ is connected to a power source voltage Vdd, and the other main electrode thereof is connected to the vertical signal line 8 through the address transistor $Q_D$. The gate electrode of the address transistor $Q_D$ is connected from the vertical scan circuit 4 to a vertical selection line 12.

The other main electrode of the reset transistor $Q_R$ is connected to the power source voltage Vdd, and the gate electrode thereof is connected from the vertical scan circuit 4 to a reset line 13.

Reference numeral 15 represents a buffer circuit connected to the vertical selection line 12, and reference numeral 16 represents a buffer circuit connected to a reset line 13.

Figure 3:
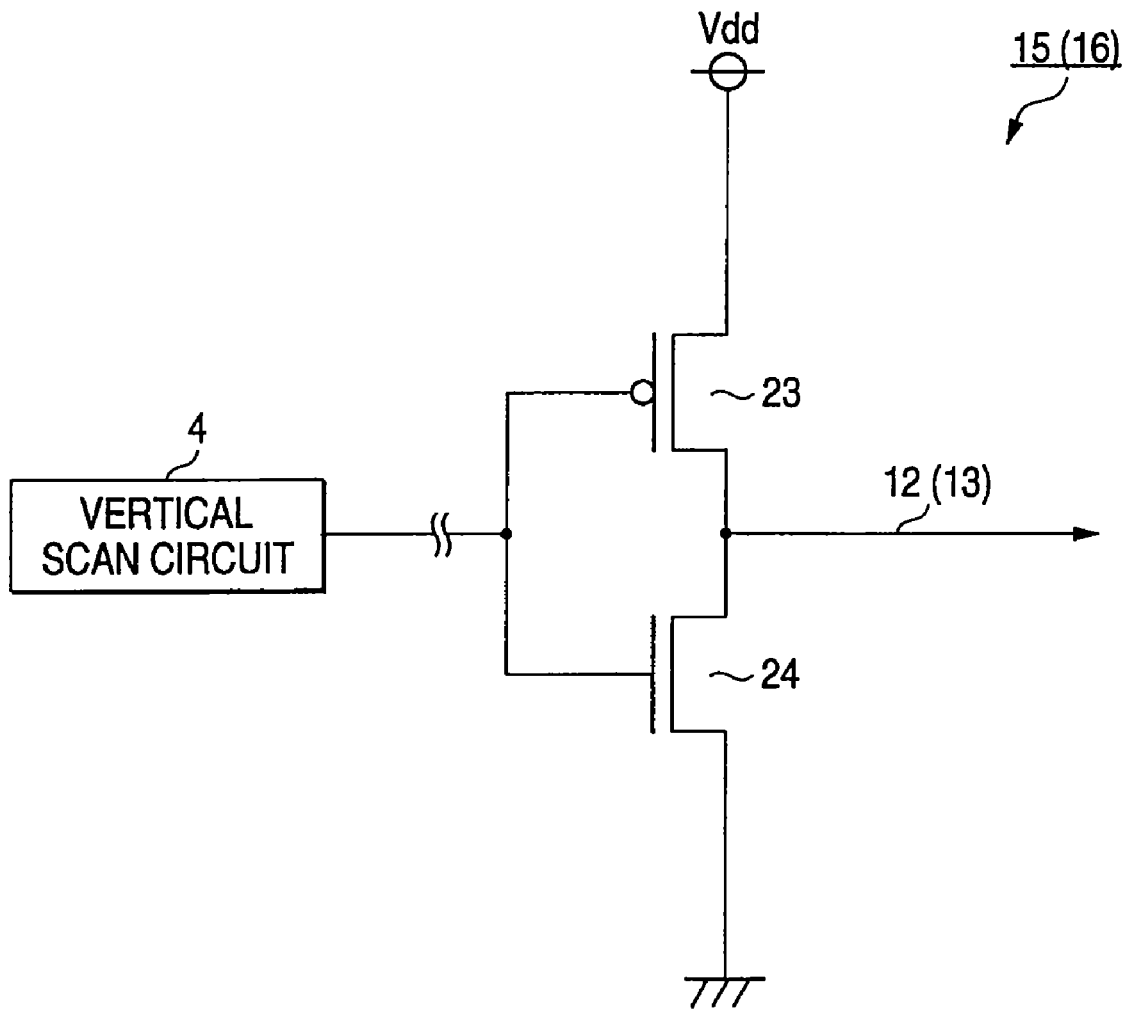
FIG. 3 is a circuit diagram showing an example of a buffer circuit applied to the present invention.

As shown in FIG. 3, each of the buffer circuits 15, 16 is formed of a p-channel MOS transistor 23 and an n-channel MOS transistor 24, that is, it is formed of a so-called inverter circuit based on a CMOS transistor. The drain side of the p-channel MOS transistor 23 is connected to the power source voltage Vdd, and the source side of the n-channel transistor 24 is connected to the ground (GND). The input side of the inverter circuit is connected to the vertical scan circuit 4, and the output side thereof is connected to the vertical selection line 12 or the reset line 13.

In order to make the understanding easy, in this embodiment, each of the buffer circuits 15, 16 is constructed by one-stage inverter circuit, however, it may be constructed by plural-stages of inverter circuits.

In the buffer circuits 15, 16, when a low-level pulse is applied from the vertical scan circuit 4 side, the p-channel MOS transistor 23 is turned on to output the power source voltage Vdd to the vertical selection line 12 or the reset line 13 at the output side. When a high-level pulse is applied, the n-channel MOS transistor 24 is turned on to output the negative voltage to the vertical selection line 12 or the reset line 13 at the output side.

A negative load transistor (MOS transistor) $Q_L$ serving as a constant-current source is connected to one end of each vertical signal line 8, and the CDS/signal holding circuit 6 is connected to the other end of each vertical signal line 8 through a switch element (MOS transistor) $Q_S$. The CDS/signal holding circuit 6 is a circuit for outputting the difference of two voltage signals input in time-series.

An operation pulse $\phi_L$ is applied to the gate of the negative load transistor $Q_L$, and an operation pulse $\phi_{SH}$ is applied to the switch element $Q_S$.

The output terminal of the CDS/signal holding circuit 6 is connected to the horizontal signal line 9 through a horizontal switch element (MOS transistor) $Q_H$. The horizontal switch element $Q_H$ is controlled by a horizontal scan pulse $\phi_H$ ($\phi_{H1}$, $\phi_{H2}$, . . . ) applied from the horizontal scan circuit 5 to the gate of the horizontal switch element $Q_H$.

Further, this embodiment is equipped with means for applying a negative voltage to the gate electrode of the transfer transistor $Q_T$ during a charge accumulation period, that is, a negative voltage generating circuit 21. The negative voltage generating circuit 21 may be comprise a well-known voltage-increasing circuit, that is, a circuit for increasing the ground (GND) voltage to the negative side when viewed from the power source voltage. The output of the negative voltage generating circuit 21 is input to a buffer circuit 31 connected to the vertical scan circuit 4.

Figure 4:
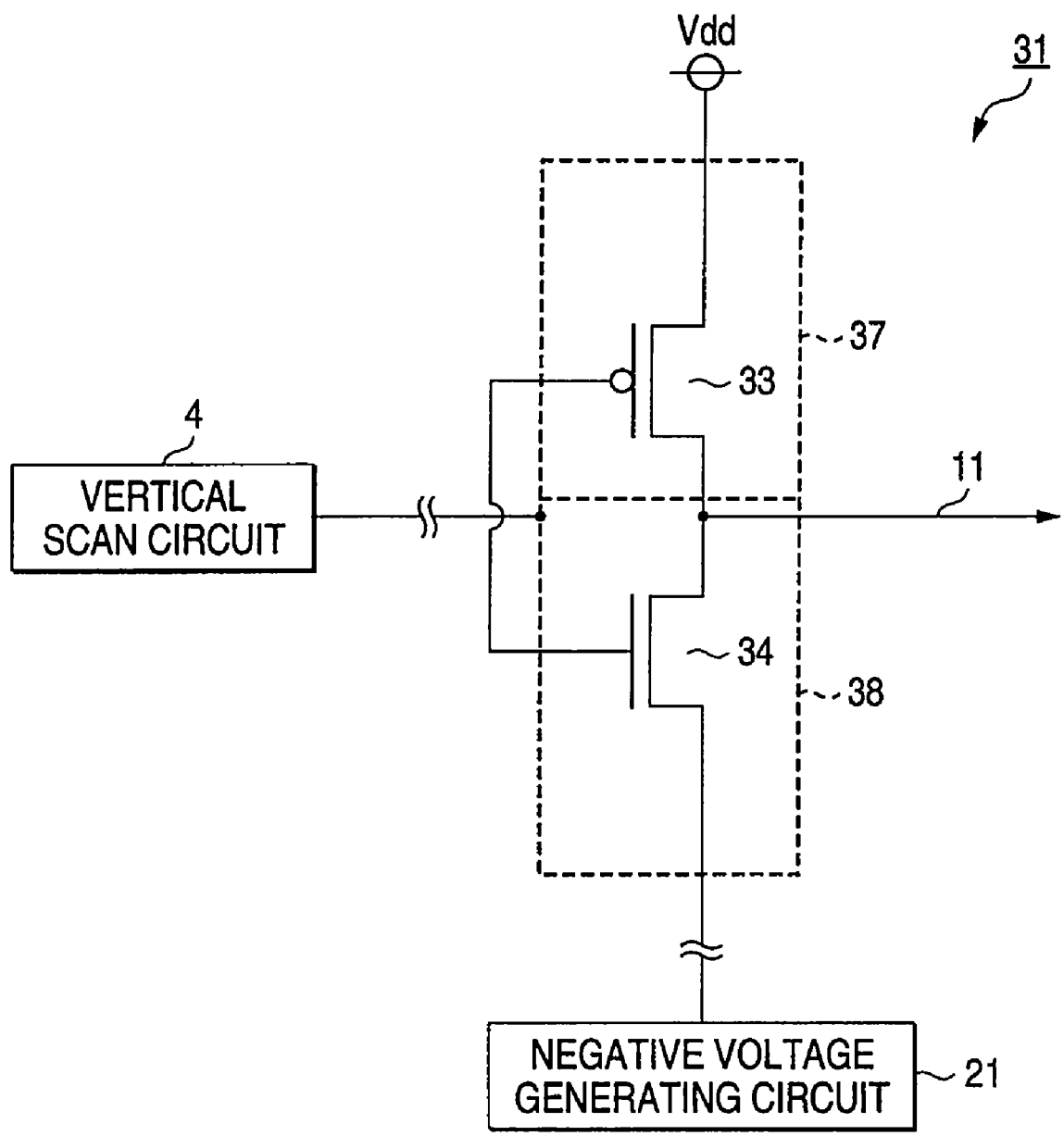
FIG. 4 is a circuit diagram showing another example of the buffer circuit applied to the present invention.

As shown in FIG. 4, the buffer circuit 31 is constructed by a p-channel MOS transistor 33 and an n-channel MOS transistor 34, that is, it is constructed by an inverter circuit based on a so-called CMOS transistor. The power source voltage Vdd is connected to the drain side of the p-channel MOS transistor 33, and the negative voltage generating circuit 21 is connected to the source side of the n-channel transistor 34. The input terminal of the inverter circuit is connected to the vertical scan circuit 4, and the output terminal thereof is connected to the vertical read-out line 11.

In order to make the understanding easy, in this embodiment, the buffer circuit 31 is constructed by one-stage inverter circuit, however, it may be constructed by plural-stages inverter circuits.

As shown in FIG. 1, the buffer circuit 31 is separately formed by the semiconductor well region 36. More specifically, as shown in FIG. 4, the p-channel MOS transistor 33 is formed in the n-type semiconductor well region 37, and the n-channel MOS transistor 34 is formed in the p-type semiconductor well region 38. Accordingly, the output of the negative voltage generating circuit 21 is input to the p-type semiconductor well region 38 of the buffer circuit 31 and the source region of the n-type channel MOS transistor 34 in the p-type semiconductor well region 38. The threshold value of the n-channel MOS transistor 34 is set to a high value.

In the buffer circuit, thus, the inverter circuit 31, when a low-level pulse is input from the vertical scan circuit 4 side, the p-channel MOS transistor 33 is turned on to output the power source voltage Vdd to the vertical read-out line 11 at the output side. When a high-level pulse is input, the n-channel MOS transistor 34 is turned on to output the negative voltage to the vertical read-out line 11 at the output side.

Figure 2:
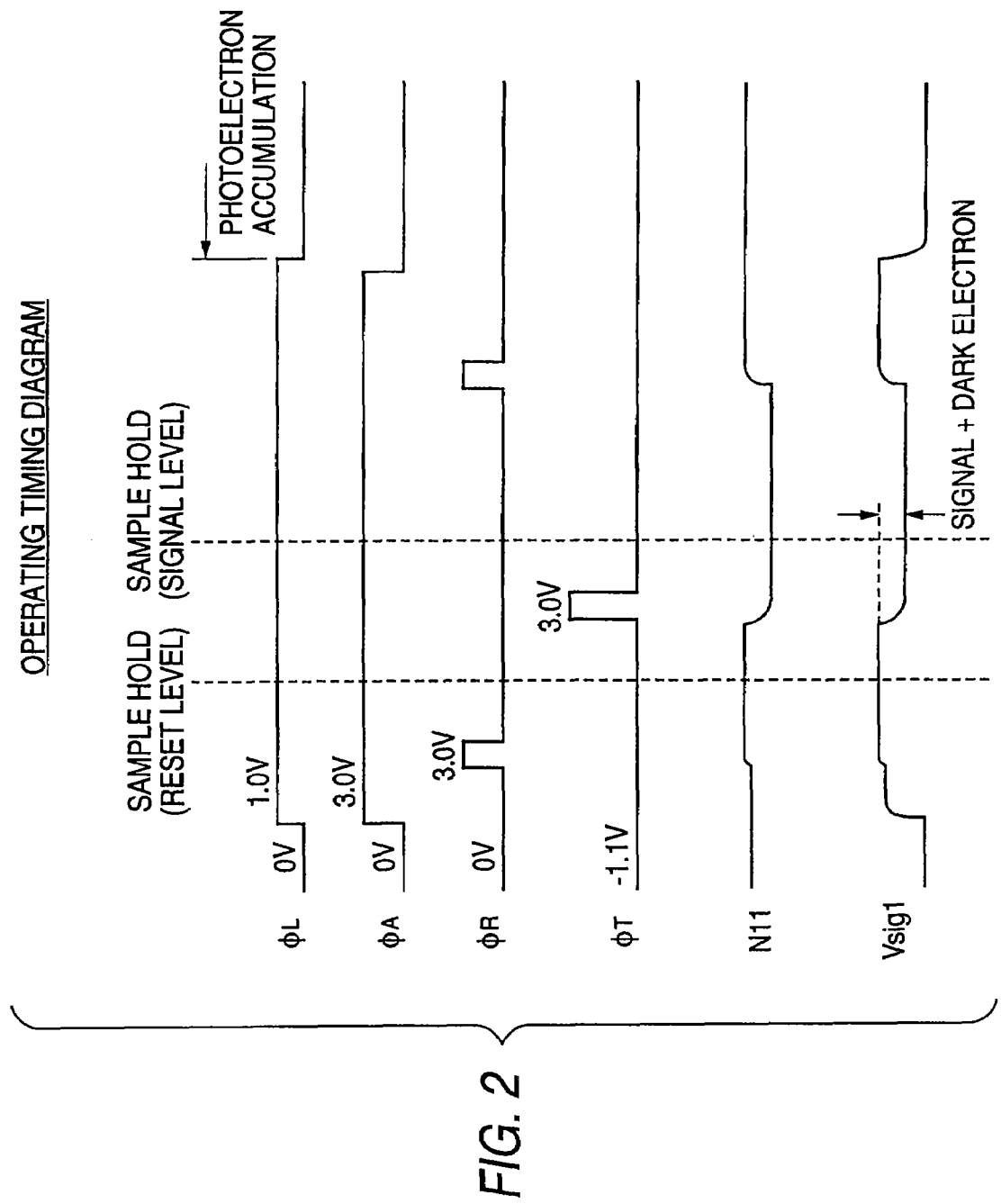
FIG. 2 is an operation timing charge to describe the operation of the solid-state image pickup device of FIG. 1.

Next, the operation of the above-described MOS type solid-state image pickup device 1 will be described with reference to the operation timing chart of FIG. 2. In this case, the power source voltage Vdd is set to 3.0V, for example, and the output of the negative voltage generating circuit 21 is set to −1.1V, for example. The description is made while the pixel $2_{11}$ at the lower left side of FIG. 1 is representatively noted.

First, at the non-selection time of the pixel of the first line containing the pixel $2_{11}$ (during so-called charge accumulation period), the operation pulse $\phi_L$ applied to the gate of the load MOS transistor $Q_L$ ($Q_{L1}$, $Q_{L2}$), the read-out pulse $\phi_{T1}$ supplied to the vertical read-out line 11, the selection pulse $\phi_{A1}$ supplied to the vertical signal line 12 and the reset pulse $\phi_{R1}$ supplied to the reset line $13_1$ are set to the low level. Here, the low level of only the read-out pulse $\phi_{T1}$ is set to the negative potential, for example −1.1V by receiving the output of the negative voltage generating circuit 21. The other pulses $\phi_L$, $\phi_{A1}$, $\phi_{R1}$ are set to 0V.

The potential of the detection portion $N_{11}$ is equal to a value lower than the power source voltage of 3.0V, and the potential $V_{sig1}$ of the vertical signal line $8_1$ is equal to 0V, whereby the transfer transistor $Q_{T11}$, the address transistor $Q_{D11}$ and the reset transistor $Q_{R11}$ are turned off, and signal charges are accumulated in the photodiode $PD_{11}$. In this embodiment, so-called photoelectron accumulation is carried out.

Subsequently, the operation pulse $\phi_L$ and the selection pulse $\phi_{A1}$ are set to high level, and the load MOS transistor $Q_L$ and the address transistor $Q_D$ of first line are switched on. At this time, the load MOS transistor $Q_L$ (the load transistor $Q_{L1}$ in the noted pixel $2_{11}$) and the amplifying transistor $Q_A$ of first line (the amplifying transistor $Q_{A11}$ in the noted pixel $2_{11}$) form a source follower circuit, and the voltage corresponding to the potential of the detection portion $N_{11}$ appears on the vertical signal line $8_1$.

Next, the reset pulse $\phi_{R1}$ (high level) is applied to the gate of the reset transistor $Q_R$. At this time, dark charges (dark electrons in this embodiment) accumulated in the detection portion $N_{11}$ are swept out and the detection portion $N_{11}$ is reset to the power source voltage Vdd, so that the potential of the vertical signal line $8_1$ is also set to the corresponding value.

Subsequently, the potential of the vertical signal line $8_1$ is input as reset level into the CDS/signal holding circuit $6_1$.

Subsequently, the read-out pulse (high level) is applied to the transfer transistor $Q_T$ of the first line through the vertical read-out line $11_1$. At this time, the transfer transistor $Q_T$ of the first line is switched on, and the signal charges and the dark charges in the photodiode $PD_{11}$ are transferred through the transfer transistor $Q_{T11}$ to the detection portion $N_{11}$. In conformity with this operation is lowered the potential of the detection portion $N_{11}$. The potential of the vertical signal line $8_1$ is also varied by the amount corresponding to the total charge amount of the signal charges and the dark charges by the source follower circuit comprising the load MOS transistor $Q_{L1}$ and the amplifying transistor $Q_{A11}$.

The potential of the vertical signal line $8_1$ is input as signal level through the switch element $Q_{s1}$ to the CDS/signal holding circuit $6_1$, and the difference between the potential thus input and the above-described reset level is taken and held.

Subsequently, the reset pulse $\phi_{R1}$ (high level) is applied through the reset line $13_1$ to the reset transistor $Q_R$ to turn on the reset transistor $Q_R$ (the reset transistor $Q_{R11}$ in the noted pixel $2_{11}$). The detection portion $N_{11}$ is reset to the power source voltage, and the potential of the vertical signal line $8_1$ is also reset to the corresponding potential.

The selection pulse $\phi_{A1}$ is returned to the low level (0V). Since the source follower circuit is set to the off state, the pixels of the line concerned are returned to the non-selection state, and the charge accumulation is started. The vertical signal line $8_1$ is returned to 0V.

Subsequently, the charge accumulation period is kept until the next line of pixels is selected.

Through the above operation, all the pixels of the first line containing the pixels other than the noted pixel $2_{11}$ are driven at the same time, and the signals of one line (that is, the difference signal between the signal level and the reset level) are stored in the CDS/signal holding circuit 6 ($6_1$, $6_2$) at the same time.

Subsequently, as not shown in FIG. 2, the horizontal scan circuit 5 is driven to apply the horizontal scan pulse $\phi_H$ to the horizontal switch element $Q_H$ ($Q_{H1}$, $Q_{H2}$) so that the signals of the pixels of one line held in the CDS/signal holding circuit 6 are successively led to the horizontal signal line 9 and output from the output terminal $t_{out}$ through the output amplifier 7.

If the same operation is carried out on the pixels of the second line, the signals of the second line are read out, and the pixels of all the lines can be read out by successively driving the vertical scan circuit 4.

It is important in this embodiment that the potential of the transfer gate of the transfer transistor $Q_T$ is set to a negative value during the charge accumulation period. If the potential of the transfer gate is negative, the amplitude of the voltage of the transfer gate is increased and thus the saturation signal amount is also increased to thereby enlarge the dynamic range.

It is further important in this embodiment that the value of the negative potential of the transfer gate is set to such a level (in this embodiment, −1.1V) that a channel (in this embodiment, a channel for holes) is formed below the gate. During the charge accumulation period, dark current flows into the photodiode PD together with the photoelectrically-converted charges. As described above, the main origin of generating dark current when the photodiode PD comprises a so-called embedded photodiode having such a structure that an area having the opposite conduction type (for example, p-type semiconductor region) to that of a charge accumulation area (for example, n-type semiconductor region) of the photodiode is formed at the interface between the photodiode and the oxide film is the oxide film interface below the transfer gate as described above. Here, by setting the transfer gate to a negative potential and forming a cannel for holes, the dark current can be prevented without degrading the transfer characteristic.

Figure 9:
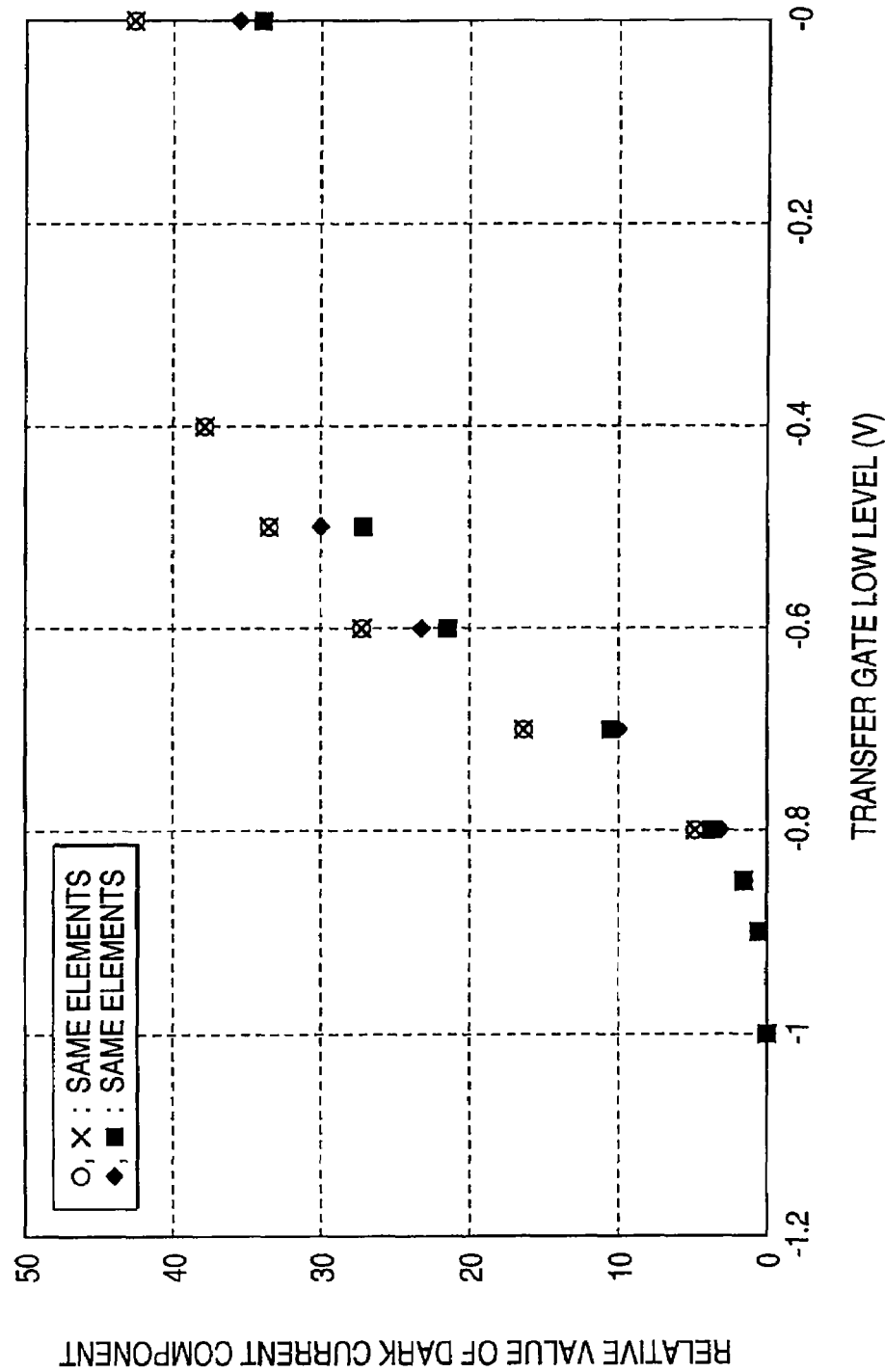
FIG. 9 is a characteristic diagram showing the relationship between the negative potential of a transfer gate and dark current of a pixel to describe the present invention.

FIG. 9 is a characteristic diagram showing the relationship between the dark current of a pixel and the negative voltage to be applied to the transfer gate electrode of the transfer transistor PD. The axis of abscissas represents the negative potential of the transfer gate (the low level of the gate voltage) (V), and the axis of ordinates represents the relative values of dark current components. The measurement was made on two types of pixels which have the same pixel circuit construction and are different in layout. Signs of O and X represent two samples of a first layout (same pixels), and signs of ♦, ■ represent two samples of a second layout (same pixels).

From the characteristic diagram of FIG. 9, it is proved that the dark current can be reduced irrespective of the layout of the pixels by applying a negative voltage to the transfer gate during the charge accumulation period. When the negative potential was reduced to about −0.5V, the reduction of the dark current appeared, and when the negative potential was equal to about −0.8 or less, the dark current was substantially equal to zero. In this embodiment, the negative potential to be applied to the transfer gate is set to −0.5V or less, preferably to −0.8V or less.

FIGS. 5 to 8 show embodiments the constituting parts of pixels, particularly, photodiodes PD and transfer transistors $Q_T$ of various embodiments applied to the present invention.

Figure 5:
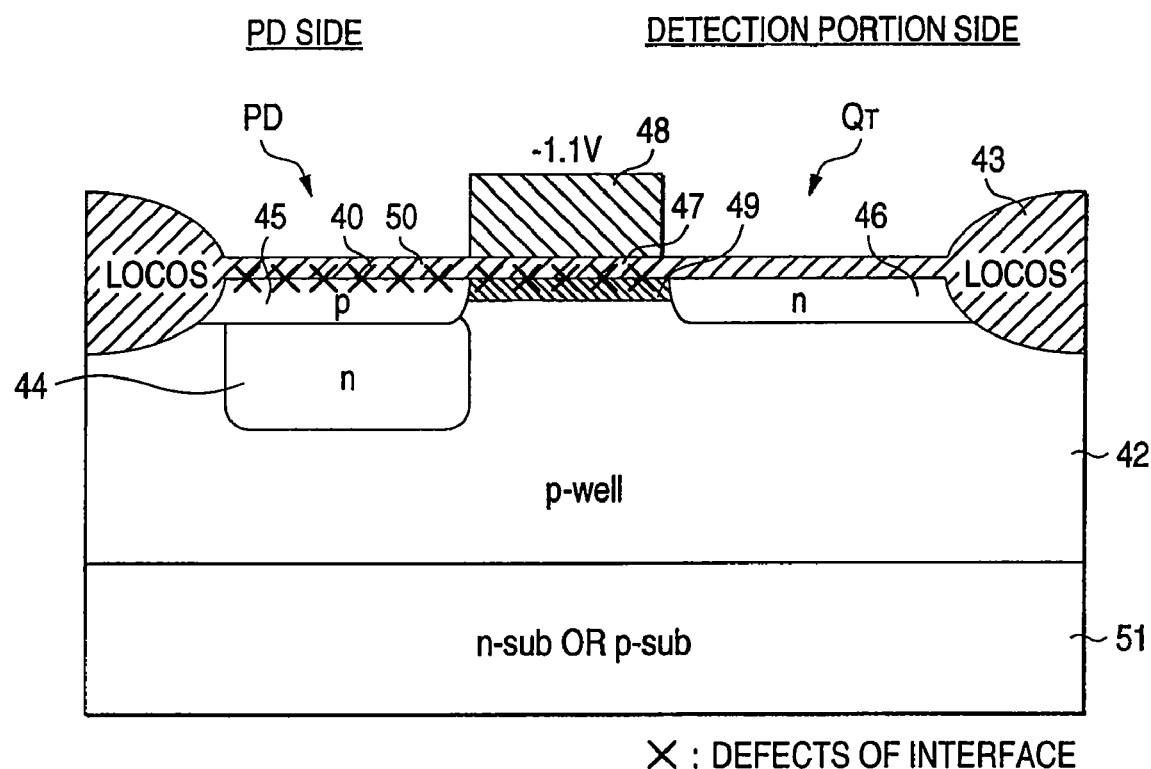
FIG. 5 is a cross-sectional view showing an embodiment of the constituting part of a photodiode and a transfer transistor which constitute a pixel applied to the present invention.

An embodiment of FIG. 5 is constructed by forming a second conduction type, for example, p-type semiconductor well region 42 on an n-type or p-type semiconductor substrate 41 and then forming a photodiode PD and a transfer transistor $Q_T$ in a pixel area which is sectioned by an element separation layer ($SiO_2$ layer) 43 formed by selective oxidation (LOCOS) of the p-type semiconductor well region 42. The photodiode PD is constructed as a so-called embedded photodiode by forming a first conduction type, for example, n-type semiconductor region 44 serving as a charge accumulation region on a p-type semiconductor well region 42, and then forming a p-type semiconductor region 45 having the opposite conduction type to the n-type semiconductor region 44 on the surface of the n-type semiconductor region 44.

The transfer transistor $Q_T$ is constructed by setting the n-type semiconductor region 44 of the photodiode PD as one source/drain region and forming a transfer gate electrode 48 through a gate insulating film (for example, SiO film) 47 between the region 44 and the other source/drain region 46 formed in the p-type semiconductor well region 42. The other n-type semiconductor region 46 of the transfer transistor $Q_T$ is constructed as a detection portion N.

In this construction, crystal defects 40 occur at the interface with the insulating film (for example, oxide film) 50 on the photodiode PD and at the gate insulating film interface below the transfer gate, however, occurrence of dark current from the oxide film interface of the photodiode PD can be prevented by the p-type semiconductor region 45 of the embedded photodiode PD. Further, occurrence of dark current from the interface below the transfer gate can be prevented by setting the potential of the transfer gate electrode 48 to a negative value, for example, −1.1V to form an inverted layer, that is, a channel portion 49 for holes below the gate electrode 48.

Figure 6:
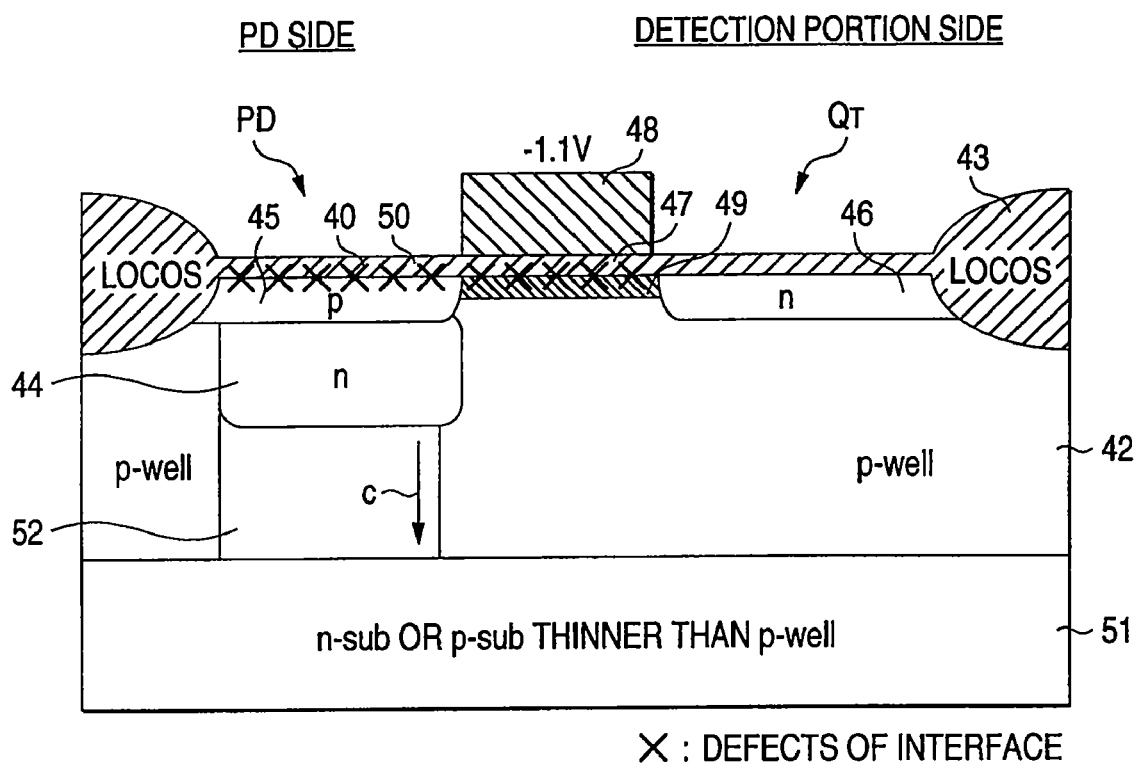
FIG. 6 is a cross-sectional view showing another embodiment of the constituting part of the photodiode and the transfer transistor which constitute a pixel applied to the present invention.

An embodiment shown in FIG. 6 is constructed by modifying the construction of FIG. 5 so that an n-type semiconductor substrate 51 or a p-type semiconductor substrate 51 having an impurity concentration lower than that of a p-type semiconductor well region 42 is used as a semiconductor substrate, and a semiconductor region 52 based on an n⁻ region having an impurity concentration lower than that of the p-type semiconductor well region 42 or based on a p⁻ region is formed just below the n-type semiconductor region 44 of the photodiode PD so as to extend to the semiconductor substrate 51. The other construction is the same as shown in FIG. 5. The corresponding elements to those of FIG. 5 are represented by the same reference numerals, and the duplicative description is omitted from the following description.

In this construction, occurrence of dark current from the oxide film interface of the photodiode PD and dark current from the interface below the transfer gate can be prevented by the same construction as shown in FIG. 5. Further, since the n-type semiconductor substrate or the p-type semiconductor substrate having the impurity concentration lower than that of the p-type semiconductor well region 42 is used as the semiconductor substrate 51, and also the semiconductor region 52 based on the n⁻ region having the impurity concentration lower than that of the p-type semiconductor well region 42 or the p⁻ region is formed only just below the photodiode PD in place of the p-type semiconductor well region 42, so that the overflow path of charges can be set in the longitudinal direction from the photodiode PD to the semiconductor substrate 51 as indicated by an arrow c.

Accordingly, the area of the overflow path can be set to a large value, so that the function of the overflow path is enhanced and the blooming suppressing capability can be enhanced. Therefore, the potential of the overflow path (semiconductor region 52) is set to a low value, so that the saturation signal amount of the photodiode PD can be increased and the dynamic range can be enlarged. This overflow path structure is effective irrespective of the negative potential of the transfer gate, however, if it is used in combination with the negative potential of the transfer gate, the reduction of the capability as the overflow path of the channel portion can be compensated, and thus the effect is particularly enhanced.

Figure 7:
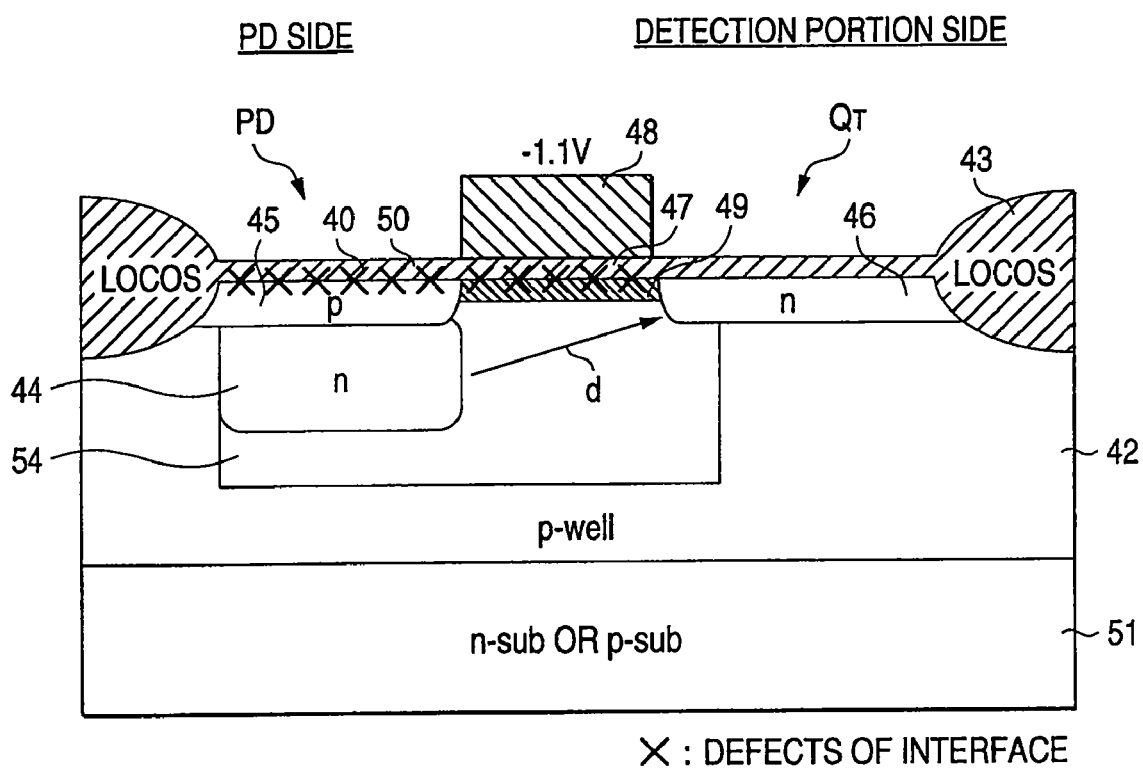
FIG. 7 is a cross-sectional view showing another embodiment of the constituting part of the photodiode and the transfer transistor which constitute a pixel applied to the present invention.

An embodiment shown in FIG. 7 is constructed by modifying the construction of FIG. 5 so that a semiconductor region 54 based on an n⁻ region having an impurity concentration lower than that of the p-type semiconductor well region 42 or a p⁻ region is formed in an area extending from a portion just below the photodiode PD to the source/drain region 46 of the transfer transistor $Q_T$ serving as the detection portion N. At least the area between the photodiode PD and the source/drain region 46 serving as the detection portion N is formed of the semiconductor region 54 based on the n⁻ region having a lower impurity concentration or the p⁻ region. The other construction is the same as shown in FIG. 5. Therefore, the corresponding parts to those of FIG. 5 are represented by the same reference numerals, and the duplicative description thereof is omitted from the following description.

In this construction, occurrence of the dark current from the oxide film interface of the photodiode PD and the dark current from the interface below the transfer gate is prevented by the same construction as shown in FIG. 5. Further, no p-type semiconductor well region 42 is formed in the portion extending from the photodiode PD to the source/drain region 46 of the detection portion N, but the semiconductor region 54 based on the n⁻ region having the impurity concentration lower than that of the p-type semiconductor well region 42 or the p⁻ region is formed in place of the p-type semiconductor well region 42, and the overflow path is set so as to pass under the channel portion forward the detection portion N as indicated by an arrow d. Therefore, as in the case of FIG. 6, the area of the overflow path is increased and the blooming suppressing capability is enhanced, and the potential of the overflow path (semiconductor region 54) can be set to a low value, so that the saturation signal amount of the photodiode PD can be increased and the dynamic range can be enlarged.

Figure 8:
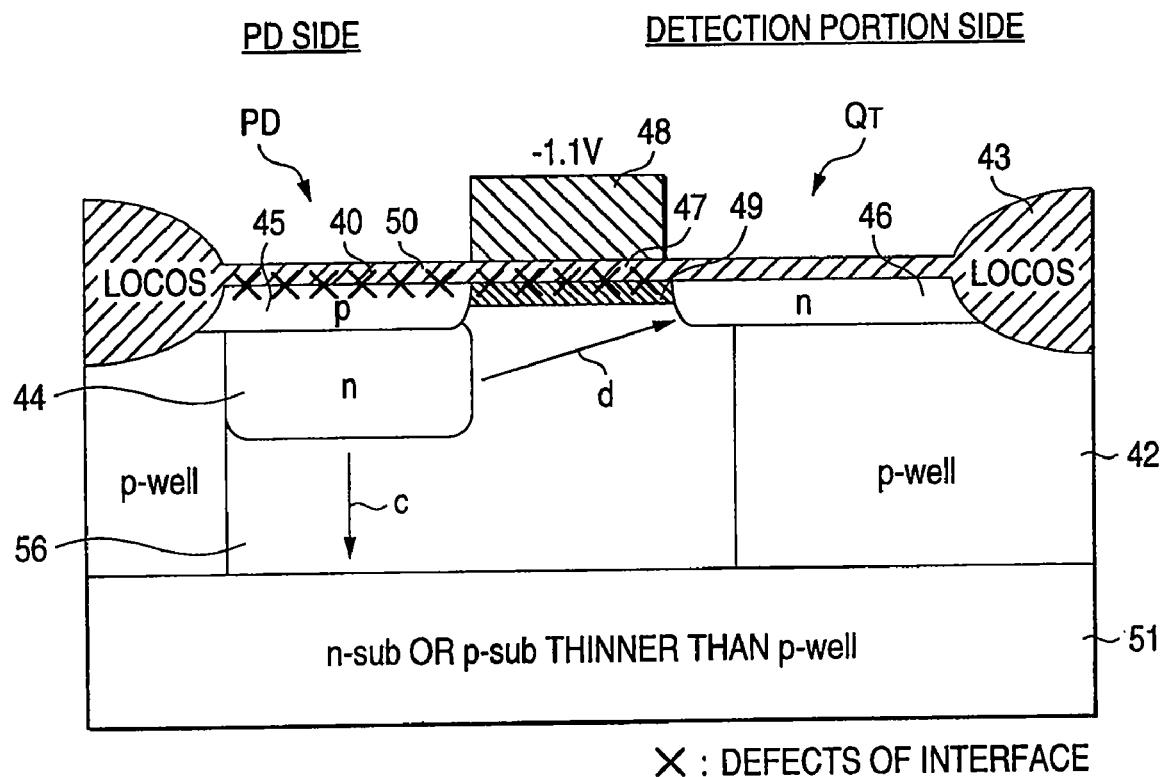
FIG. 8 is a cross-sectional view showing another embodiment of the constituting part of the photodiode and the transfer transistor which constitute a pixel applied to the present invention.

An embodiment of FIG. 8 is constructed by combining the constructions of FIGS. 6 and 7. That is, in the construction of FIG. 5, the semiconductor substrate 56 based on the n⁻ region having an impurity concentration lower than that of the p-type semiconductor well region 42 or the p⁻ region is formed so as to extend from the lower side of the n-type semiconductor region 44 of PD through the lower side of the channel portion and the just lower side of a part of the n-type source/drain region and reach the semiconductor substrate 51. The other construction is the same as shown in FIG. 5. Therefore, the corresponding parts to those of FIG. 5 are represented by the same reference numerals, and the duplicative description thereof is omitted from the following description.

In this construction, the overflow path is formed so as to extend to the substrate 41 side and the detection portion N side as indicated by arrows c, d and the same effect as shown in FIG. 6 can be achieved.

The semiconductor regions 52, 54, 56 based on the n⁻ region having lower impurity concentration or the p⁻ region are not particularly formed of FIGS. 6 to 8, and the impurity concentration of the substrate can be directly used.

According to the MOS type solid-state image pickup device 1 of the above embodiments, by applying the negative voltage to the gate electrode 48 of the transfer transistor $Q_T$ during the charge accumulation period for which the charges are accumulated in the photodiode PD, the dark current components occurring below the transfer gate are suppressed, and the dark current in the solid-state image pickup device can be reduced, so that S/N can be enhanced and the image quality can be enhanced. At this time, the reduction of the dark current itself contributes to enlargement of the dynamic range. By applying the negative voltage to the gate electrode 48, the amplitude of the gate voltage can be increased, and the saturation signal amount of the photodiode PD, that is, the number of saturation electrons is increased, thereby enlarging the dynamic range.

The semiconductor region 52, 54 or 56 constructed by the n⁻ region or p⁻ region is formed and the overflow path is formed in a bulk out of the channel portion of the transfer transistor $Q_T$, so that the area of the overflow path can be increased and the function of the overflow path can be greatly enhanced. Accordingly, the blooming can be excellently suppressed. Further, both the suppression of the blooming and the enlargement of the dynamic range are compatible with each other.

In FIG. 1, the negative voltage generating circuit 21 is installed in the solid-state image pickup device as the means for inputting the negative voltage to the transfer gate. However, a voltage input terminal may be separately equipped to the device to input the negative voltage from the external of the solid-state image pickup device.

In FIG. 1, the pixel 2 is constructed by a photodiode PD and four MOS transistors $Q_T, Q_A, Q_D, Q_L$, however, the pixel may be designed in any other construction insofar as it contains at least a photodiode and a transfer transistor $Q_T$.

In the above embodiments, the present invention is applied to an MOS type solid-state image pickup device in which signal charges are electrons, however, the present invention may be applied to an MOS type solid-state image pickup device in which signal charges are holes. In this case, the transfer transistor comprises a p-channel MOS transistor having the opposite conduction type to that described above. Accordingly, when charges are accumulated in the photodiode, a positive voltage, that is, a positive voltage which is increased to a value higher than the power source voltage is applied as the gate voltage of the p-channel transfer transistor. Further, the construction of the pixels in FIGS. 5 to 8 is modified so that the conduction types of each substrate and each semiconductor region are inverted. The overflow path may be formed in the same manner.

According to the solid-state image pickup device of the present invention, the gate voltage of the transfer transistor when electrons or holes are accumulated as charges into the photodiode is set to a negative voltage or positive voltage, whereby the dark current can be greatly reduced and S/N can be enhanced to improve the image quality. By using the negative voltage or positive voltage, the amplitude of the transfer gate can be increased, so that the saturation signal amount of the photodiode can be increased and the dynamic range can en enlarged. The reduction of the dark current itself contributes to the enhancement of the dynamic range.

An area extending to one of the substrate side and the detection portion side or both the substrate side and the detection portion side is formed of an n-type semiconductor substrate having an impurity concentration lower than that of a semiconductor well region or a p-type semiconductor region in a bulk out of the channel portion of the transfer transistor so that the area functions as an overflow path, whereby the cross-sectional area of the overflow path can be set to a large value and the function of the overflow path is enhanced to sufficiently suppress blooming. Further, the dynamic range can be also enlarged together with the suppression of the blooming.

According to the driving method for the solid-state image pickup device according to the present invention, the gate voltage of the transfer transistor when electrons or holes are accumulated as charges into the photodiode is set to a negative voltage or positive voltage, whereby the dark current can be dramatically reduced, and S/N and the image quality of the solid-state image pickup device can be enhanced. Further, since the amplitude of the transfer gate can be increased, the saturation signal amount of the photodiode can be increased and the dynamic range can be enlarged.

The charges overflowing from the photodiode are passed through the bulk out of the channel portion of the transfer transistor and flow to one of the substrate side and the detection portion side or both the substrate side and the detection portion side, so that the blooming can be sufficiently suppressed. The dynamic range can be also enlarged together with the suppression of the blooming.

What is claimed is:

1. A solid-state image pickup device including:
a plurality of pixels each comprising (1) a photodiode, (2) a detection portion and (3) a transfer transistor for transferring charges accumulated in said photodiode to said detection portion,
wherein,
an overflow path for discharging charges overflowing from said photodiode is formed in a bulk out of a channel portion of said transfer transistor and discharges the charges in a depth direction of a substrate,
said overflow path is formed of a first conductive type semiconductor region formed on the surface of a n-type semiconductor region in an area extending from the portion just below said photodiode to a semiconductor substrate, and
said area is formed of the second conductive type semiconductor region having an impurity concentration lower than that of a semiconductor well region or the p-type semiconductor region.

2. The solid-state image pickup device as claimed in claim 1, wherein said overflow path is formed in the area between said photodiode and said detection portion, and said area is formed of an n-type semiconductor region having an impurity concentration lower than that of a semiconductor well region or a p-type semiconductor region.

3. The solid-state image pickup device as claimed in claim 1, wherein said overflow path is formed in an area extending from the portion just below said photodiode and the area between said photodiode and said detection portion to a semiconductor substrate, and said area is formed of an n-type semiconductor region having an impurity concentration lower than that of a semiconductor well region or a p-type semiconductor region.

* * * * *